US012755067B2

(12) United States Patent
Fang et al.

(10) Patent No.: US 12,755,067 B2
(45) Date of Patent: Oct. 6, 2026

(54) OPTIMAL DESIGN METHOD FOR MIDDLE CROSS BEAM OF ROPS FRAMEWORK AND CAB FOR ENGINEERING MACHINES

(71) Applicant: JIANGSU XCMG CONSTRUCTION MACHINERY RESEARCH INSTITUTE LTD., Xuzhou (CN)

(72) Inventors: Younian Fang, Xuzhou (CN); Lanzhong Yang, Xuzhou (CN); Yilin Lu, Xuzhou (CN)

(73) Assignee: JIANGSU XCMG CONSTRUCTION MACHINERY RESEARCH INSTITUTE LTD. (CN)

( * ) Notice: Subject to any disclaimer, the term of this patent is extended or adjusted under 35 U.S.C. 154(b) by 90 days.

(21) Appl. No.: 18/247,642

(22) PCT Filed: Jul. 29, 2022

(86) PCT No.: PCT/CN2022/108855
§ 371 (c)(1),
(2) Date: Apr. 2, 2023

(87) PCT Pub. No.: WO2024/000722
PCT Pub. Date: Jan. 4, 2024

(65) Prior Publication Data

US 2025/0117535 A1 Apr. 10, 2025

(30) Foreign Application Priority Data

Jun. 29, 2022 (CN) ......................... 202210749401.1

(51) Int. Cl.
*G06F 30/17* (2020.01)

(52) U.S. Cl.
CPC .................................. *G06F 30/17* (2020.01)

(58) Field of Classification Search
CPC ...... G06F 2119/14; G06F 30/17; G06F 30/20; Y02T 90/00
See application file for complete search history.

(56) References Cited

U.S. PATENT DOCUMENTS

| | | | | |
|---|---|---|---|---|
| 6,286,897 | B1 * | 9/2001 | Ruhter | E02F 9/2004 296/190.08 |
| 2010/0314908 | A1 * | 12/2010 | Wood, Jr. | B62D 33/0617 296/190.08 |
| 2025/0117534 | A1 * | 4/2025 | Yang | G06F 30/17 |

FOREIGN PATENT DOCUMENTS

| | | | | |
|---|---|---|---|---|
| CN | 107176214 A | * | 9/2017 | B62D 33/063 |
| CN | 110886339 A | * | 3/2020 | E02F 9/163 |
| CN | 210508617 U | * | 5/2020 | |

OTHER PUBLICATIONS

Kumar, Abhay, et al. "Agricultural tractor cabin structure design for durability and rollover protective structure test." Symposium on International Automotive Technology 2015 223126. (Year: 2015).*

(Continued)

*Primary Examiner* — Aniss Chad

(57) ABSTRACT

Disclosed are an optima design method for a middle cross beam of an ROPS framework and a cab for engineering machines. The optimal design method comprises: solving a height dimension of a middle cross beam when the maximum bending moment on pillars is minimum by analyzing the influence of the height dimension of the middle cross beam in a portal hyperstatic structural mechanics model on the distribution relation of two bending moments on the pillars, to obtain an optimal height dimension relation of the middle cross beam; and obtaining a profile sectional parameter design relation of the middle cross beam by analyzing a design objective that the middle cross beam and the pillars enter a plastic deformation zone at the same time, and using the relation to guide the selection of an ROPS framework (Continued)

structure and profiles to improve the design quality of an ROPS framework.

6 Claims, 3 Drawing Sheets

(56) References Cited

OTHER PUBLICATIONS

Karakulak, Selen Sağsöz, and Emre Yetkin. "Agricultural tractor cabin safety analysis and test correlation." International journal of automotive Science and technology 4.1 (2020): 1-9. (Year: 2020).*
Mangado, J., et al. "Design calculations on roll-over protective structures for agricultural tractors." Biosystems Engineering 96.2 (2007): 181-191. (Year: 2007).*

* cited by examiner

OPTIMAL DESIGN METHOD FOR MIDDLE CROSS BEAM OF ROPS FRAMEWORK AND CAB FOR ENGINEERING MACHINES

FIELD

The invention belongs to the technical field of cabs for engineering machines, and relates to an optimal design method for a middle cross beam of an ROPS framework and a cab for engineering machines.

BACKGROUND

An ROPS framework has become a standard configuration of the cab of engineering machines which work in severe environments. According to test requirements, the ROPS framework should meet the loading requirements of lateral, vertical and longitudinal loads and lateral load energy. During lateral loading, the cab is elastic-plastically deformed, plastic hinges appear at positions, where the bending moment is maximum or the structure is weak, of the framework to realize large lateral deformation displacement of the framework, which is beneficial for the absorption of lateral impact loads.

A middle cross beam can increase the number of plastic hinges to greatly improve the load capacity of the ROPS framework, but different height dimensions and sectional dimensions of the middle cross beam are designed in vehicle plants. According to a traditional design method, designers construct an ROPS framework based on empirical data and then optimize the structure based on simulation analysis. However, due to the inadequate experience of designers and the long design cycle, a quick optimal design method is urgently needed.

SUMMARY

Objective: to overcome the defects of the prior art, the invention provides an optimal design method for a middle cross beam of an ROPS framework and a cab for engineering machines.

The invention provides a method for designing the height position of a middle cross beam of anROPS framework, and also provides a method for designing the optimal ratio of the sectional inertia moment of the middle cross beam to the sectional inertia moment of pillars of the ROPS framework, such that lightweight design of the ROPS framework is realized.

The invention provides an optimal ROPS framework structure by analyzing the loading features of an ROPS test.

Technical solution: the technical solution adopted by the invention to solve the above technical problems is as follows:

In one aspect, the invention provides an axially symmetric ROPS framework, which comprises pillars, cross beams, longitudinal beams and a middle cross beam;

Wherein, the pillars comprise A-pillars, B-pillars and D-pillars; the cross beams comprise top cross beams and bottom cross beams; the longitudinal beams comprise top longitudinal beams and bottom longitudinal beams;

The two A-pillars are connected through a first top cross beam and a first bottom cross beam to form a closed rectangular A-ring;

The two B-pillars are connected through a second top cross beam and a second bottom cross beam to form a closed rectangular B-ring;

The two D-pillars are connected through a third top cross beam and a third bottom cross beam to form a closed rectangular D-ring, two ends of the middle cross beam are connected to inner sides of middle portions of the two D-pillars respectively, and the third top cross beam, the middle cross beam and the third bottom cross beam are arranged in parallel;

Four corners of the A-ring and corresponding four corners of the B-ring are connected through a first top longitudinal beam and a first bottom longitudinal beam, and four corners of the B-ring and four corresponding corners of the D-ring are connected through a second top longitudinal beam and a second bottom longitudinal beam, such that a closed spatial framework structure is formed.

In some embodiments, the ratio of a height dimension U of the middle cross beam to a length dimension L of the D-pillars is $n_1$, and $n_1$ ranges from 0.45 to 0.55.

In some embodiments, the ratio of a sectional inertia moment of the middle cross beam to a sectional inertia moment of the D-pillars is $n_2$, and $n_2$ ranges from 1.15 to 1.45.

In a second aspect, the invention provides an optimal design method for the middle cross beam of the axially symmetric ROPS framework, which comprises:

S1, establishing a mechanics model: extracting a length dimension W of the middle cross beam, the length dimension L of the corresponding pillars and the height dimension L of the middle cross beam according to the ROPS framework structure to form a portal hyperstatic structural mechanics model;

S2, selecting design parameters: selecting the height dimension L, of the middle cross beam, which is proved to have an influence on the lateral load capacity of an ROPS by analyzing ROPS test data, as a design parameter of the ROPS framework structure; selecting a profile sectional inertia moment I, which is a key factor determining bending moment distribution in the mechanics model, as a design parameter of profiles;

S3: performing structural mechanics analysis: analyzing bending stress of the portal hyperstatic structural mechanics model by means of structural mechanics software to obtain the height dimension IA of the middle cross beam when a maximum bending moment Max ($M_{pillar\ bottom}$, $M_{pillar\ middle}$) on the pillars is minimum, so as to obtain the ratio $n_1$ of the height dimension $L_d$ of the middle cross beam to the length dimension L of the corresponding pillars;

Analyzing the bending stress of the portal hyperstatic structural mechanics model by means of the structural mechanics software to obtain the ratio $n_2$ of the sectional inertia moment of the middle cross beam to the sectional inertia moment of the corresponding pillars when the height dimension $L_d$ of the middle cross beam is optimal and the maximum bending stress of the middle cross beam is equal to the maximum bending stress of the corresponding pillars of the ROPS framework, wherein $n_2$ ranges from 1.15 to 1.45;

S4: establishing a relation: obtaining an optimal height dimensional relation of the middle cross beam according to the ratio $n_1$ of the height dimension $L_d$ of the middle cross beam to the length dimension L of the corresponding pillars;

Obtaining a profile sectional parameter design relation of the middle cross beam according to the ratio $n_2$ of the sectional inertia moment of the middle cross beam to the sectional inertia moment of the corresponding pillars; and Determining a height position of the middle cross beam of the ROPS framework according to the optimal height dimension relation of the middle cross beam, and selecting profiles of the middle cross beam and the corresponding pillars according to the profile sectional parameter design relation of the middle cross beam.

In some embodiments, the length dimension W of the middle cross beam is 1.45 m-1.6 m, and the length dimension L of the corresponding pillars is 1.65 m-1.9 m.

In some embodiments, the optimal height dimension relation of the middle cross beam is $L_d = n_1 \cdot L$. Further, $n_1$ ranges from 0.45 to 0.55.

In some embodiments, an optimal design relation of the middle cross beam is $I_{middle\_cross\ beam} = n_2 \cdot I_{pillar}$. Further, the ratio $n_2$ of the sectional inertia moment of the middle cross beam to the sectional inertia moment of the corresponding pillars ranges from 1.15 to 1.45.

In a third aspect, the invention further provides a cab for engineering machines, which comprises the axially symmetric ROPS framework.

Beneficial effects: according to the optimal design method for the middle cross beam of the ROPS framework and the cab for engineering machines, the optimal height dimension of the middle cross beam and the optimal ratio of the sectional inertia moment of the middle cross beam to the sectional inertia moment of the corresponding pillars are obtained by analyzing the structural mechanics model. The method can greatly shorten the design time of the ROPS framework and improve the design quality of the ROPS framework. The invention has the following advantages:

(1) The invention provides a method for designing the height position of the middle cross beam of the ROPS framework, and also provides a method for designing the optimal ratio of the sectional inertia moment of the middle cross beam to the sectional inertia moment of pillars of the ROPS framework;

(2) The invention provides a closed "ring" ROPS framework structure beneficial to force transfer, (3) The design method provided by the invention can be implanted into an intelligent design software database.

Figure 1:
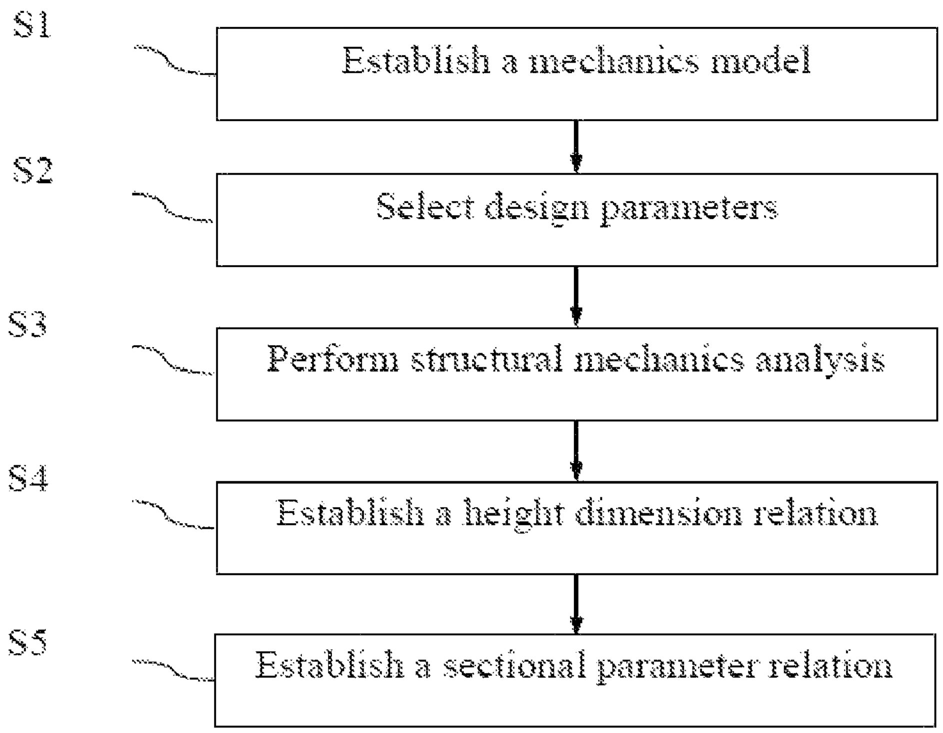
FIG. 1 illustrates a flow diagram of an optimal design method for a middle cross beam of an ROPS framework according to one embodiment.

In the figures: 1, pillar, 2, top cross beam; 3, middle cross beam; 4, bottom cross beam; 5, corner bracket; 6, limiting device.

DETAILED DESCRIPTION

The technical solutions of the embodiments of the invention will be clearly and completely described below in conjunction with the accompanying drawings of these embodiments. Obviously, the embodiments in the following description are merely illustrative ones, and are not all possible ones of the invention. The following description of at least one illustrative embodiment is merely explanatory, and should not be construed as any limitation of the invention or the application or use of the invention. All other embodiments obtained by those ordinarily skilled in the art according to the following ones without creative labor should fall within the protection scope of the invention.

Unless otherwise expressly stated, the relative arrangement of components and steps, numeral expressions and numerical values expounded in the embodiments of the invention are not intend to limit the scope of the invention. Moreover, it should be understood that, for the sake of convenient description, the components in the drawings are not drawn according to actual dimension scale. Techniques, methods and devices known by those ordinarily skilled in related art may not be discussed in detail, and in proper cases, these techniques, method and devices should be construed as one part of the granted specification. In all examples illustrated and discussed here, any specific value should be interpreted as illustrative rather than restrictive. Thus, other examples of the illustrative embodiments may have different values. It should be noted that similar reference signs and alphabets represent similar items in the drawings below. Thus, once one item is defined in one drawing, it will not be further discussed in subsequent drawings.

In the description of the disclosure, it should be understood that terms such as "first" and "second" are used for defining parts merely for the purpose of distinguishing corresponding parts. Unless otherwise stated, these terms have no special meanings, and should not be construed as limitations of the protection scope of the disclosure.

In the description of the application, it should be understood that terms such as "central". "longitudinal", "cross", "front", "back", "left", "right", "vertical", "horizontal", "top", "bottom", "inner" and "outer" are used to indicate directional or positional relations based on the accompanying drawings merely for the purpose of facilitating and simplifying the description, and do not indicate or imply that devices or elements referred to must be in a specific direction, or be configured and operated in a specific direction, so they should not be construed as limitations of the contents protected by the invention.

DEFINITION OF TERMS

Figure 2:
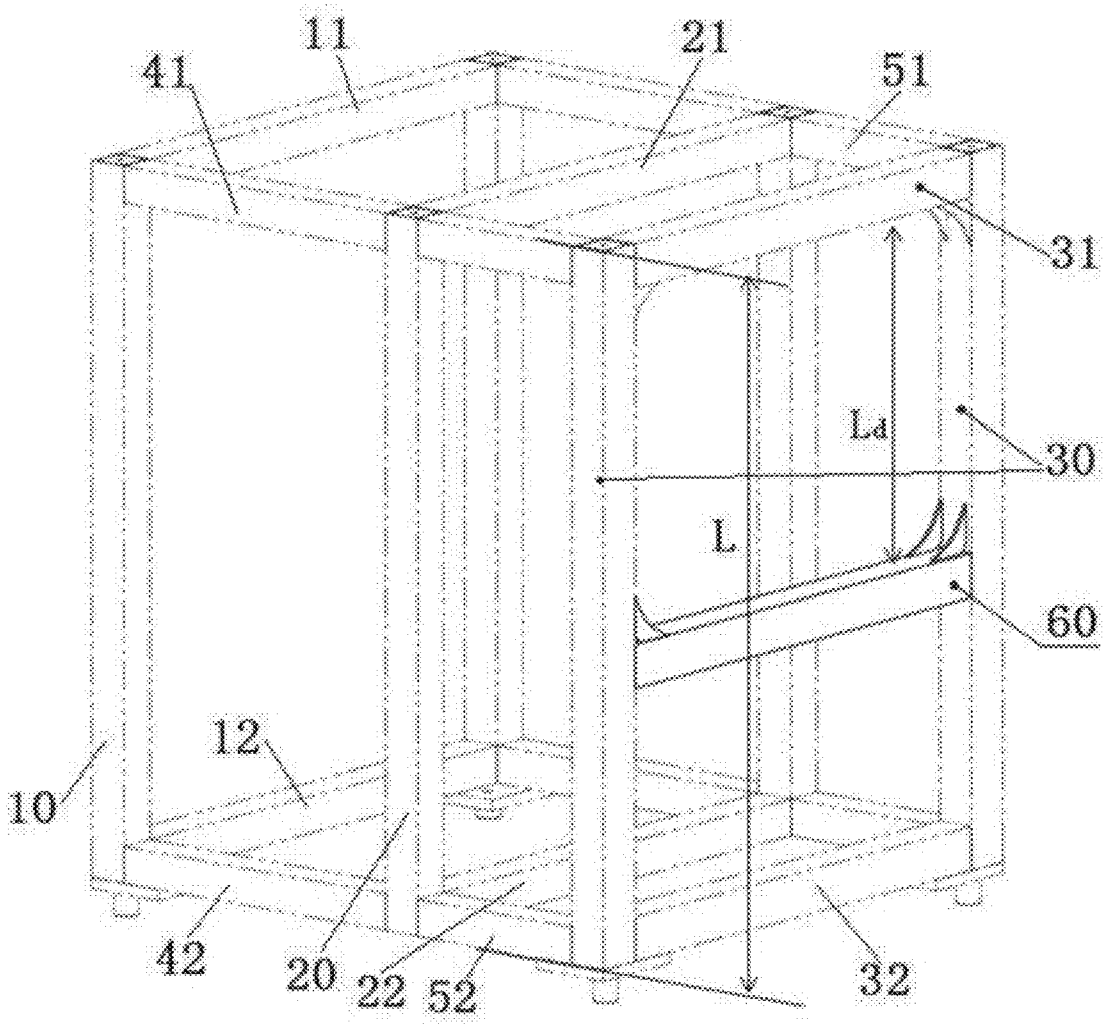
FIG. 2 illustrates a middle cross beam reinforcing structure of an ROPS framework according to one embodiment of the invention.
Figure 3:
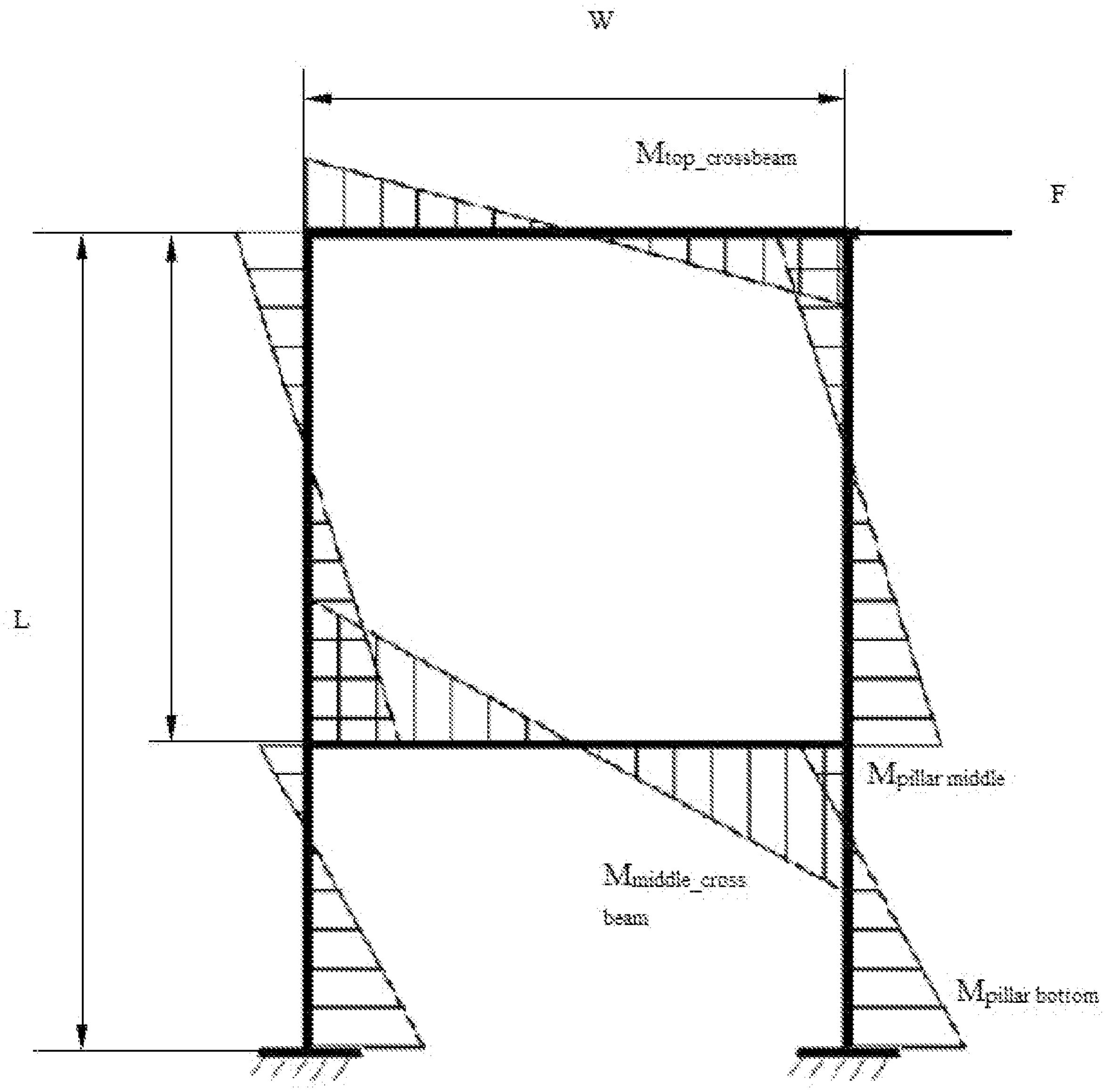
FIG. 3 illustrates a portal hyperstatic structural mechanics model of an ROPS framework according to one embodiment.

ROPS—rollover protective structure, a series of structural members for reducing the possibility of injuries to a driver wearing a seat belt in the event of a roll-over, ROPS framework—spatial framework structure designed to meet ROPS design requirements;

Pillar—part or component for vertical supporting,

Cross beam—horizontally arranged beam;

Top cross beam—cross beam at the top of the framework;

Sectional inertia moment I—the integral of a quadratic product of the area of micro-elements on a cross section and the distance from the micro-elements to a designated axis on the cross section; it is a geometric parameter for evaluating the sectional bending resistance of a component, and unless otherwise specifically stated, the axis of the sectional inertia moment passes through the centroid of the cross section;

Plastic hinge—a point appearing on a local part of a component of the ROPS framework subject to a bending moment, of which the opposite side yields but is not destroyed, and around which the component rotates within a limited angle;

Plastic deformation zone—a state where the ROPS framework can no longer maintain a static structure in presence of multiple plastic hinges during lateral loading;

On the basis that the strictest requirement of the ROPS tests is the lateral loading test, to facilitate lateral load transfer, a middle cross beam reinforcing structure of an ROPS framework shown in FIG. 2 and a portal hyperstatic structural mechanics model shown in FIG. 3 are established; according to the influence of the height dimension of a middle cross beam on the distribution relation of two bending moments on the corresponding pillars: pillar bottom bending moment $M_{pillar\ bottom}$ and pillar middle bending moment $M_{pillar\ middle}$, the height dimension of the middle cross beam when the maximum bending moment on the pillars $Max(M_{pillar\ bottom}, M_{pillar\ middle})$, so as to obtain an optimal height dimension relation of the middle cross beam; and the design objective that the middle cross beam and the pillars enter a plastic deformation zone at the same time is analyzed to obtain a relation of the ratio of the sectional inertia moment of the middle cross beam to the sectional inertia moment of the pillar, and the relation is used to guide the selection of an ROPS framework structure and profiles.

Embodiment 1

An axially symmetric and closed "ring" framework structure comprises pillars 2, top cross beams 2, a middle cross beam 3 and bottom cross beams 4; one end of each top cross beam is connected to a top end of one of two pillars, and the other end of the top cross beam is connected to a top end of the other one of the two pillars; one end of each bottom cross beam is connected to a bottom end of one of two pillars, and the other end of the bottom cross beam is connected to a bottom end of the other one of the two pillars; two ends of the middle cross beam are connected to inner sides of middle portions of two pillars 1, and a third top cross beam, the middle cross beam and a third bottom cross beam are arranged in parallel, such that the closed "ring" framework structure is formed.

In some embodiments, corner brackets 5 are disposed at joints of the pillars 1, the top cross beams 2 and the middle cross beam 3, and a limiting device 6 is disposed at the bottom of the cab ROPS framework.

In some embodiments, as shown in FIG. 2, an axially symmetric cab ROPS framework comprises pillars, cross beams, longitudinal beams and a middle cross beam 60;

Wherein, the pillars comprise A-pillars 10, B-pillars 20, and D-pillars 30; the cross beams comprise top cross beams and bottom cross beams; the longitudinal beams comprise top longitudinal beams and bottom longitudinal beams;

The two A-pillars 10 are connected through a first top cross beam 11 and a first bottom cross beam 12 to form a closed rectangular A-ring;

The two B-pillars 20 are connected through a second top cross beam 21 and a second bottom cross beam 22 to form a closed rectangular B-ring;

The two D-pillars 30 are connected through a third top cross beam 31 and a third bottom cross beam 32 to form a closed rectangular D-ring;

Two ends of the middle cross beam 60 are connected to inner sides of middle portions of the two D-pillars respectively, and the third top cross beam, the middle cross beam and the third bottom cross beam are arranged in parallel;

Four corners of the A-ring and corresponding four corners of the B-ring are connected through a first top longitudinal beam 41 and a first bottom longitudinal beam 42, and four corners of the B-ring and corresponding four corners of the D-ring are connected through a second top longitudinal beam 51 and a second bottom longitudinal beam 52, such as a closed spatial framework structure is formed.

The A-ring, the B-ring and the D-ring are rectangular structures, and the whole ROPS framework is an axially symmetric structure.

In some embodiments, the ratio of a height dimension $L_d$ of the middle cross beam to a length dimension L of the D-pillars is $n_1$, and $n_1$ ranges from 0.45 to 0.55; the ratio of the sectional inertia moment of the middle cross beam to the sectional inertia moment of the D-pillars is $n_2$, and $n_2$ ranges from 1.15 to 1.45. The ROPS framework is designed through an optimal design method in Embodiment 2.

Wherein, the longitudinal beams comprise top longitudinal beams and bottom longitudinal beams; to guarantee the flatness of the bottom of the whole ROPS framework, the bottom longitudinal beams and the bottom cross beams are basically located on a same plane (for example, the bottom longitudinal beams and the bottom cross beams are arranged horizontally); however, the length of the A-pillars, the length of the B-pillars and the length of the D-pillars are not definitely identical, so the top longitudinal beams and the top cross beams are not definitely located on a same plane.

Embodiment 2

As shown in FIG. 1, an optimal design method for a middle cross beam of an axially symmetric ROPS framework comprises:

S1, establishing a mechanics model: extracting a length dimension W of a middle cross beam (W is 1.45 m-1.6 m), a length dimension L of corresponding pillars (L is 1.65 m-1.9 m) and a height dimension $L_d$ of the middle cross beam according to an ROPS framework structure to form a portal hyperstatic structural mechanics model;

S2, selecting design parameters: selecting the height dimension $L_d$ of the middle cross beam, which is proved to have an influence on the lateral load capacity of an ROPS by analyzing ROPS test data, as a design parameter of the ROPS framework structure; selecting a profile sectional inertia moment I, which is a key factor determining the bending moment distribution in the mechanics model, as a design parameter of profiles;

S3: performing structural mechanics analysis: analyzing the bending stress of the portal hyperstatic structural mechanics model by means of structural mechanics software to obtain the height dimension $L_d$ of the middle cross beam when a maximum bending moment $Max\ (M_{pillar\ bottom}, M_{pillar\ middle})$ on the pillars is minimum, so as to obtain the ratio $n_1$ of the height dimension $L_4$ of the middle cross beam to the length dimension L of the corresponding pillars, wherein $n_1$ ranges from 0.45 to 0.55;

Analyzing the bending stress of the portal hyperstatic structural mechanics model by means of the structural mechanics software to obtain the ratio $n_2$ of the sectional inertia moment of the middle cross beam to the sectional inertia moment of the corresponding pillars when the height dimension $L_d$ of the middle cross beam is optimal and the maximum bending stress of the middle cross beam is equal to the maximum bending stress of the corresponding pillars of the ROPS framework, wherein $n_2$ ranges from 1.15 to 1.45;

S4: establishing a height dimension relation: obtaining an optimal height dimensional relation of the middle cross beam according to the ratio $n_1$ of the height dimension $L_d$ of the middle cross beam to the length dimension L of the corresponding pillars: $L_d=n_1 \cdot L$;

S5, establishing a profile sectional parameter relation: obtaining a profile sectional parameter design relation of the middle cross beam $I_{middle\_cross\ beam}=n_2 \cdot I_{pillar}$ according to the ratio $n_2$ of the sectional inertia moment of the middle cross beam to the sectional inertia moment of the corresponding pillars; and Determining a height position of the middle cross beam of the ROPS framework according to the optimal height dimension relation of the middle cross beam, and selecting profiles of the middle cross beam and the corresponding pillars according to the profile sectional parameter design relation of the middle cross beam.

The optimal height dimension relation of the middle cross beam is related to the outline dimension of the ROPS framework, is an inherent attribute of the ROPS framework, and is used for guiding the optimal design of the middle cross beam of the ROPS framework. Outline dimensions of common machines can be summarized according to the design method of the invention to establish an optimal design relation database for all cab ROPS frameworks.

Embodiment 3

A cab for engineering machines comprises the ROPS framework in Embodiment 1, which is designed through the optimal design method for the middle cross beam of the ROPS framework in Embodiment 2.

In actual application, the length dimension W (W is 1.45 m-1.6 m) of the middle cross beam is the width dimension of the cab, and in case where the middle cross beam is simplified as a portal hyperstatic structural mechanics model of a simply supported beam, because the simply supported beam does not have a width, the length dimension W of the middle cross beam is used as the width dimension of the cab.

The engineering machines may be hydraulic excavators, loaders, road rollers, land levelers and the like, and have all the advantages of the ROPS framework provided by the embodiments of the disclosure.

The above embodiments are merely preferred ones of the invention. It should be pointed out that those skilled in the art can make various improvements and embellishments without departing from the principle of the invention, and all these improvements and embellishments should also fall within the protection scope of the invention.

What is claimed is:

1. A method of manufacturing a rollover protective structure (ROPS) framework, comprising:

determining, from a structure of the ROPS framework, a length dimension W of a middle cross beam, a length dimension L of corresponding pillars, and a height dimension Ld of the middle cross beam, and establishing a portal hyperstatic structural mechanics model;

selecting the height dimension Ld as a structural design parameter and a profile sectional inertia moment I as a profile design parameter;

analyzing bending stress of the portal hyperstatic structural mechanics model to determine:

(i) a ratio n1 of the height dimension Ld of the middle cross beam to the length dimension L of the corresponding pillars when a maximum bending moment of the pillars is minimized; and (ii) a ratio n2 of a sectional inertia moment of the middle cross beam to a sectional inertia moment of the corresponding pillars when the height dimension Ld is optimal and a maximum bending stress of the middle cross beam is equal to a maximum bending stress of the corresponding pillars, wherein n2 ranges from 1.15 to 1.45;

determining a height position of the middle cross beam according to the ratio n1 and selecting profiles of the middle cross beam and the corresponding pillars according to the ratio n2;

providing two A-pillars, two B-pillars, two D-pillars, top cross beams, bottom cross beams, top longitudinal beams, bottom longitudinal beams, and the middle cross beam; forming a closed rectangular A-ring by connecting the two A-pillars with a first top cross beam and a first bottom cross beam;

forming a closed rectangular B-ring by connecting the two B-pillars with a second top cross beam and a second bottom cross beam;

forming a closed rectangular D-ring by connecting the two D-pillars with a third top cross beam and a third bottom cross beam;

connecting corresponding corners of the A-ring and the B-ring with a first pair of top and bottom longitudinal beams;

connecting corresponding corners of the B-ring and the D-ring with a second pair of top and bottom longitudinal beams; and mounting and joining the middle cross beam to inner sides of middle portions of the two D-pillars at the determined height position, such that Ld/L is from 0.45 to 0.55 and the sectional inertia moment of the middle cross beam is from 1.15 to 1.45 times the sectional inertia moment of each corresponding pillar.

2. The method of claim 1, wherein the length dimension W of the middle cross beam is 1.45 m-1.6 m, and the length dimension L of the corresponding pillars is 1.65 m-1.9 m.

3. The method of claim 1, wherein the optimal height dimension relation of the middle cross beam is $L_d=n_1 \cdot L$.

4. The method of claim 1, wherein n1 ranges from 0.45 to 0.55.

5. The method of claim 1, wherein an optimal design relation of the middle cross beam is $I_{middle\_cross\ beam}=n_2 \cdot I_{pillar}$, wherein, $I_{middle\_cross\ beam}$ represents the sectional inertia moment of the middle cross beam, $I_{pillar}$ represents the sectional inertia moment of the corresponding pillars.

6. A cab for an engineering machine, the cab comprising the axially symmetric ROPS framework produced according to the method of claim 1.

* * * * *